(12) United States Patent
Kim et al.

(10) Patent No.: US 6,313,020 B1
(45) Date of Patent: Nov. 6, 2001

(54) SEMICONDUCTOR DEVICE AND METHOD FOR FABRICATING THE SAME

(75) Inventors: Hyun-Sik Kim, Kyonggi-do; Hyung-Ho Shin, Seoul, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/679,269

(22) Filed: Oct. 4, 2000

(30) Foreign Application Priority Data

Oct. 4, 1999 (KR) .................................. 99-42620

(51) Int. Cl.⁷ .................. H01L 21/3205; H01L 21/4763
(52) U.S. Cl. ...................... 438/591; 438/231; 438/259
(58) Field of Search .............. 438/52, 227, 231, 438/238, 259, 381, 396, 427, 591, 222, 295, 405, 444

(56) References Cited

U.S. PATENT DOCUMENTS

| | | | |
|---|---|---|---|
| 5,563,093 | * 10/1996 | Koda et al. | 438/231 |
| 5,907,773 | * 5/1999 | Ikemasu et al. | 438/254 |
| 5,929,483 | * 7/1999 | Kim et al. | 257/336 |
| 6,093,943 | * 7/2000 | Ikemasu et al. | 257/306 |

OTHER PUBLICATIONS

Ken–ichi Uwasawa et al., "Scaling Limitations of Gate Oxide in p+ Polysilicon Gate MOS Structures for Sub–Quarter Micron CMOS Devices", 1993 IEEE, pp. 36.5.1–36.5.4.

* cited by examiner

*Primary Examiner*—David Nelms
*Assistant Examiner*—Phuc T. Dang
(74) *Attorney, Agent, or Firm*—Marger Johnson McCollom, P.C.

(57) ABSTRACT

The present invention provides a semiconductor device and a method for fabricating the same. In the present invention, an electron depletion preventing layer is formed in a bottom portion of a polysilicon gate of MOSFET devices. In addition, the ion-implanted layer of boron ions is formed in an upper portion of the polysilicon gate to increase conductivity thereof. Because the electron depletion preventing layer is formed in the bottom portion of the polysilicon gate, electron depletion and boron penetration into the transistor channel region can be reduced and thus operational properties of the semiconductor device can be stabilized.

19 Claims, 9 Drawing Sheets

SEMICONDUCTOR DEVICE AND METHOD FOR FABRICATING THE SAME

BACKGROUND OF THE INVENTION

1. Field of the Invention

The present invention relates to a semiconductor device, and more particularly, to a polysilicon gate of a semiconductor device and a method for fabricating the same.

2. Description of the Related Art

In general, along with a continuing trend of scaling down a semiconductor device to achieve higher-integration, the size of a polysilicon gate and the thickness of a gate oxide layer has been rapidly reduced to improve performance of a semiconductor device. As a gate oxide layer gets thinner, ions for increasing conductivity of a polysilicon gate, e.g., boron ions, tend to penetrate into the gate oxide layer sufficiently to vary the threshold voltage and the saturated current. Also, electron depletion tends to increase in the polysilicon gate, as the gate oxide layer gets thinner.

Therefore, it is necessary to increase the doping level of the polysilicon gate to reduce undesired electron depletion in the polysilicon gate. In other words, if the doping level of the polysilicon gate is increased, significant progress can be made in reducing electron depletion. Therefore, in case of a NMOS transistor, a pre-doping process has been proved to bring about a 98% improvement in the level of the electrons in the polysilicon gate.

However, in case of a PMOS transistor, the pre-doping process causes penetration of boron ions into the transistor channel as well as depletion of electrons, which also significantly changes the electrical properties of a semiconductor device.

As shown in FIG. 1, the penetration of boron ions will be described in detail with reference to a conventional PMOS transistor. First of all, a gate oxide layer 30 is formed over a silicon substrate 10. A gate 40 is formed on the gate oxide layer 30. Then, a LDD (lightly doped drain) structure in which the source and drain regions are doped more lightly near the channel is formed on the silicon substrate 10 along with the gate 40 being positioned therebetween. The gate 40 typically is formed of a double layer structure comprising polysilicon layer 41 and silicide layer 43. The silicide layer 43 can be also formed over the source/drain regions.

In the conventional PMOS transistor, a boron ion-implanted layer 42 is formed over the polysilicon layer 41 to be used as a conductive gate. When the pre-doped polysilicon layer 41 is thermally treated, the boron ions from the ion-implanted layer 42 are diffused along the grain boundary of the polysilicon layer 41 at various speeds to thereby penetrate through the gate oxide layer 30 into the transistor channel region of the silicon substrate 10.

Furthermore, even if the doping level of the polysilicon gate increases, there is still a limitation in reducing electron depletion. Further, with the conventional method, the electron level of the polysilicon gate can be increased only up to 92%.

In general, fluorine atoms are known to facilitate the penetration of boron ions through a gate oxide layer into a silicon substrate by enhancing diffusion, which has been disclosed by Ken-ichi Uwasawa and others in a thesis (as shown in 895pp–898pp of IEDM, 1993) titled "Scaling limitations of gate oxide in p+ polysilicon gate MOS structures for sub-quarter micron CMOS devices." This thesis discussed that a p+ polysilicon gate MOS structure is indispensable for sub-quarter micron CMOS devices because of its superior short channel property. However, when $BF_2+$ ion implantation is performed for doping the p+ polysilicon gate MOS structure, a high temperature annealing process causes a more significant penetration of $BF_2+$ ions than of B+ ions. Consequently, the penetration of ions degrades the characteristics of MOS devices, especially in terms of controllability of threshold voltage and reliability of the gate oxide layer.

On the other hand, reduction in thickness (Tox) of a gate oxide layer has been accompanied with a continuous scaling of the CMOS device, bringing about significant penetration of $BF_2+$ ions. For this reason, it is assumed that B+ ions are better for avoiding penetration of ions than are $BF_2+$ ions.

Yet, it is necessary for small CMOS devices to have shallow source/drain junctions usually formed at the same time with ion implantation of a polysilicon gate. Thus, the polysilicon gate is often doped through an ion implantation process of $BF_2+$ ions, which may cause significant penetration of $BF_2+$ ions. In order to block the penetration of the $BF_2+$ ions, a nitrided gate oxide layer has been proposed. However, there are still a few disadvantages in fabrication of the nitrided gate oxide layer because of its complicated fabrication method and deterioration of hole mobility in a PMOSFET. Therefore, an oxide layer still is a better candidate for gate dielectrics.

For these reasons, there still remains a need to reduce electron depletion and boron penetration to improve the electrical characteristics of MOSFET devices.

SUMMARY OF THE INVENTION

Therefore, it is an object of the present invention to solve the aforementioned problems and provide a semiconductor device and a method for fabricating the same that can reduce electron depletion and boron penetration into transistor channel regions.

In one embodiment, a semiconductor device of the present invention comprises a silicon substrate formed with a field oxide layer for isolating a first active region for a first transistor and a second active region for a second transistor and a gate oxide layer formed over the first and second active regions. The semiconductor device further includes a first polysilicon gate formed on a predetermined region of the gate oxide layer of the first active region, a second polysilicon gate formed on a predetermined region of the gate oxide layer of the second active region, an electron depletion preventing layer formed in a bottom portion of the first polysilicon gate to reduce electron depletion, a source/drain region formed apart at the first active region with the first polysilicon gate being positioned therebetween, and source/drain regions formed apart at the second active region with the second polysilicon gate being positioned therebetween. Preferably, spacers formed of an insulating material are formed on the sidewalls of the first and second polysilicon gates.

It is preferable that the electron depletion preventing layer be also formed in a bottom portion of the second polysilicon gate.

Fluorine F, silicon Si, germanium Ge, nitrogen N, or argon Ar are preferably used in ion implantation to form the electron depletion preventing layer of the polysilicon gates.

The present invention also includes a method for fabricating a semiconductor device which comprises forming a field oxide layer between the first and second active regions for electrically isolating the first and second transistors of the silicon substrate. The method includes forming the gate oxide layer on the silicon substrate. Then, the first and second polysilicon gates are formed on predetermined regions of the gate oxide layer on the first and second active regions and ion-implanted layers are selectively formed to be source/drain regions in the first and second active regions. Next, a spacer formed of an insulating material is preferably formed on the side walls of the first and second polysilicon gates. An electron depletion preventing layer is formed in a bottom portion of the first polysilicon gate. Ion-implanted layers are formed in the first and second active regions to be high density source/drain regions.

It is preferable to form another electron depletion preventing layer in a bottom portion of the second polysilicon gate.

Fluorine, silicon, germanium, nitrogen, or argon are preferably implanted to form the electron depletion preventing layer in the first and second polysilicon gates.

In accordance with the present invention, the electron depletion preventing layers effectively reduce electron depletion and the boron penetration. As a result, it becomes possible to obtain reliable MOSFET devices with stable operational properties of the semiconductor device.

DETAILED DESCRIPTION OF THE INVENTION

Figure 1:
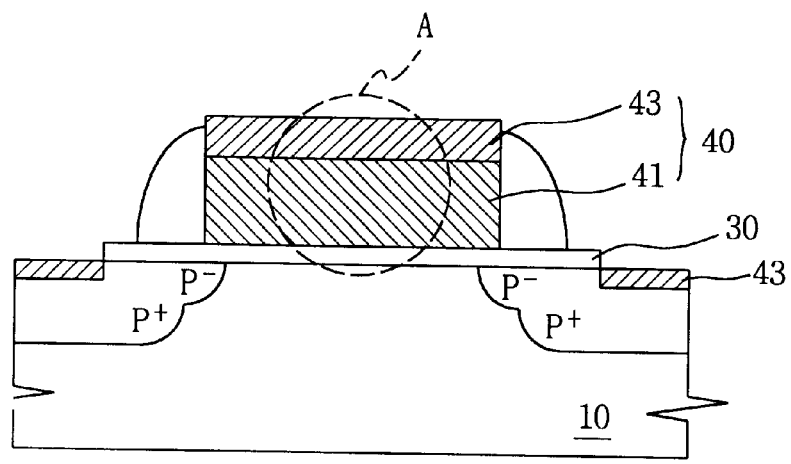
FIG. 1 is a partially enlarged cross-sectional view for illustrating the structure of a gate of a semiconductor device in accordance with the prior art.
Figure 1A:
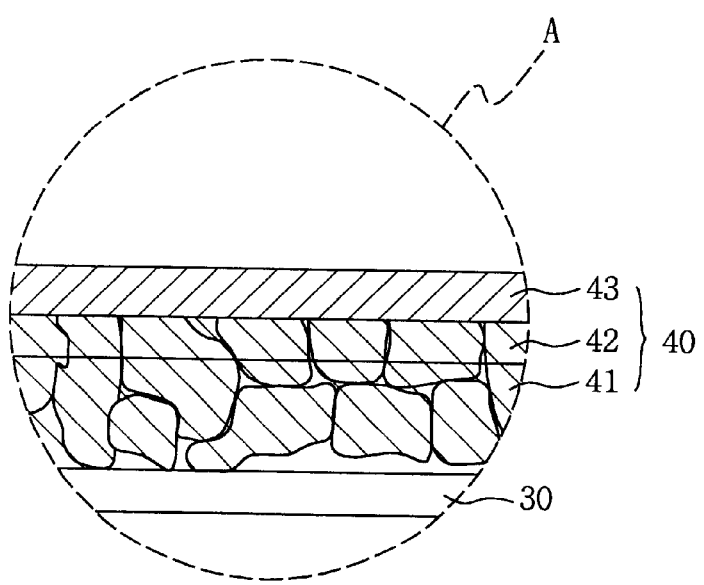

Hereinafter, according to the present invention, the semiconductor device and the method for fabricating the same will be described in detail with reference to the accompanying drawings. All the same parts of the present invention as those of the prior art will be designated with the same reference numerals.

Figure 2:
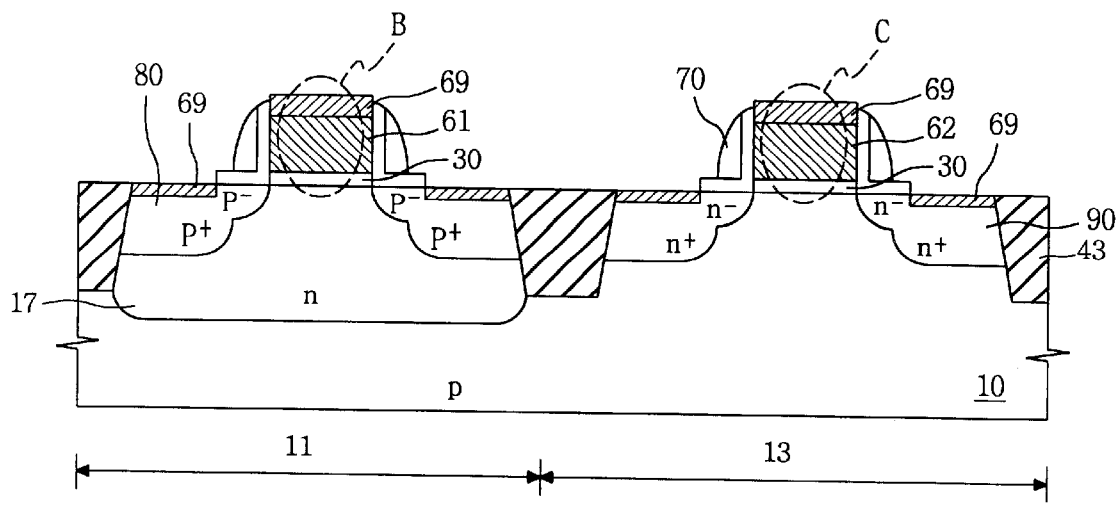
FIG. 2 is a partially enlarged cross-sectional view for illustrating the structure of a gate of a semiconductor device in accordance with the present invention.
Figure 2A:
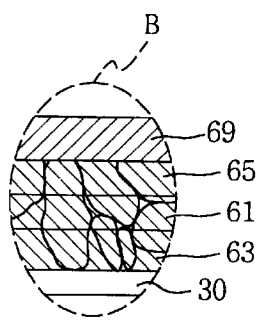
Figure 2B:
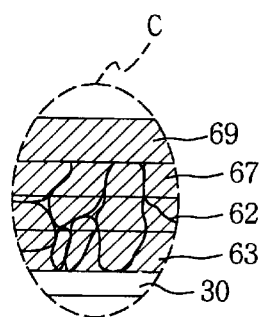

FIG. 2 is a partially enlarged view for illustrating an important part of the gate structure of the semiconductor device in accordance with the present invention.

As shown in FIG. 2, an isolation layer 15 is formed by conventional techniques such as a shallow trench isolation (STI) process, e.g., in a field region of a P type silicon substrate 10 for electrically insulating a first active region 11 for a first transistor and a second active region 13 for a second transistor. A gate oxide layer is formed over the silicon substrate of the first and second active regions. The n type well 17 is formed at the active region 11 for a PMOS transistor.

A polysilicon gate oxide layer 30 is formed over the active regions 11, 13. The first and second polysilicon gates 61, 62 are respectively formed on predetermined regions of the gate oxide layer 30 of the first and second active regions 11, 12. Then, spacers 70, formed of an insulating material, are formed on the sidewalls of the first and second polysilicon gates 61, 62.

P+ source/drain 80 region is formed in the n well 17, on either side of the polysilicon gate 61, while N+ source/drain region 90 is formed in the silicon substrate 10, on either side of a second polysilicon gate 62.

In addition, an electron depletion preventing layer 63 is formed in a bottom portion of the first polysilicon gate 61 for reducing electron depletion. An ion-implanted layer 65 is then formed in an upper portion of the first polysilicon gate 61 for increasing the conductivity of the first polysilicon gate 61. Likewise, another electron depletion preventing layer 63 is formed in a bottom portion of the second polysilicon gate 62 for reducing electron depletion. An ion-implanted layer 67 is formed in an upper portion of the first polysilicon gate 61 for increasing the conductivity of the second polysilicon gate 62.

Thus, the ions of the ion-implanted layer 65 to increase conductivity of the first polysilicon gate 61 and those of the electron depletion preventing layer 63 are both included in the first polysilicon gate 61. The region of the electron depletion layer 63 having the highest impurity concentration is placed lower than, i.e. closer to the substrate, corresponding region of the ion-implanted layer 65 having its highest impurity concentration.

At this time, fluorine (F), silicon (Si), germanium (Ge), nitrogen (N), or argon (Ar) can be ion implanted to form the electron depletion preventing layer 63. Silicide layers 69 are formed over the first and second polysilicon gates 61, 62 and over the source/drain regions 80, 90, preferably at the same time.

Therefore, in accordance with the present invention, the electron depletion preventing layer 63 is formed in a bottom portion of the first polysilicon gate 61 for reducing electron depletion. As a result, when boron ions from the ion-implanted layer 65 are diffused through the grain boundary to the electron depletion preventing layer 63 without being affected by the fluorine at the top portion of the first polysilicon gate 61, the fluorine F increases the activation rate of the boron ions.

Therefore, the present invention is effective in reducing electron depletion and penetration of boron ions into the channel region of the PMOS transistor, thus preventing any changes in the operational properties of the semiconductor device.

Similarly to the aforementioned description, an electron depletion preventing layer 63 is formed in a bottom portion of the second polysilicon gate 62 so as to reduce electron depletion in the polysilicon gate 62 of the NMOS transistor and to prevent any changes in the properties of semiconductor devices.

The method for fabricating the semiconductor device in accordance with the present invention will be described with reference to FIGS. 3 through 15. All the same reference numerals are designated for the same parts of the device as shown in FIG. 2.

Figure 3:
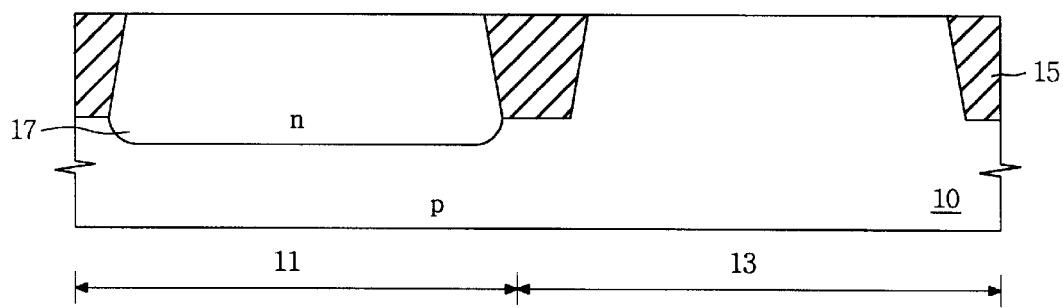
FIGS. 3 through 15 illustrate a method for sequentially fabricating a semiconductor device in accordance with the present invention.

As shown in FIG. 3, an isolation layer 15 is first formed by conventional techniques such as a shallow trench isolation (STI) process, for instance, at a field region of a P type silicon substrate 10 for electrically insulating a first active region 11 for a first transistor and a second active region 13 for a second transistor. A gate oxide layer is formed over the first and second active regions in the silicon substrate. Then, the n type well 17 is formed in the silicon substrate 10 of the active region 11.

Figure 4:
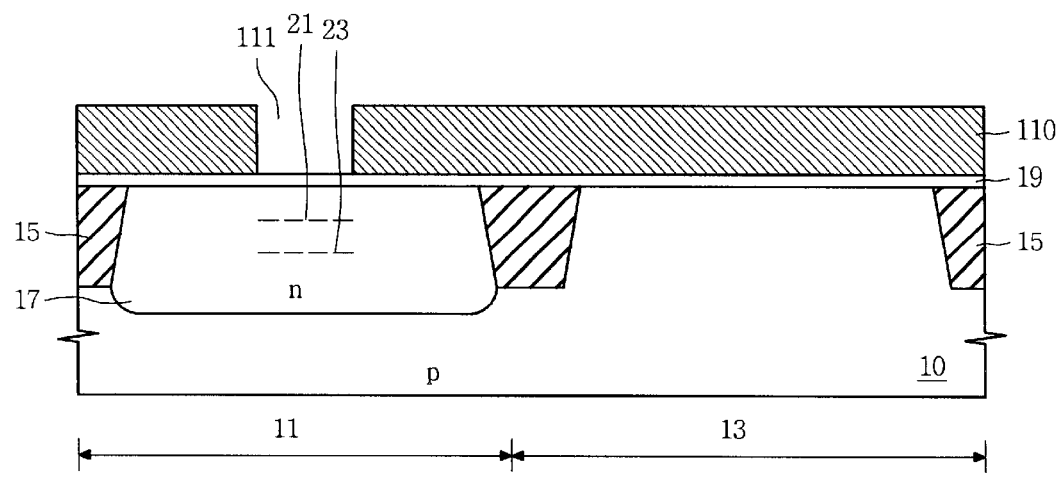

As shown in FIG. 4, a buffer oxide layer 19 is formed to a thickness of about 15 nm over the silicon substrate 10 of the active regions 11, 13. A photoresist pattern 110 is formed with an opening 111 to expose a portion of a buffer oxide layer 19 in a region to form a gate of a PMOS transistor, covering the rest of the oxide layer 19. Then, the photoresist pattern 110 is used as a mask for thinly ion implanting indium (In) ions into the n type well 17, through the opening 111, so as to form a channel ion-implanted layer 21 for controlling the threshold voltage of the PMOS transistor. The photoresist pattern 10 is also used as a mask for deeply ion implanting boron ions into the n type well 17 through the opening 111, to thereby form a channel-stop ion-implanted layer 23 to prevent punch-through.

Figure 5:
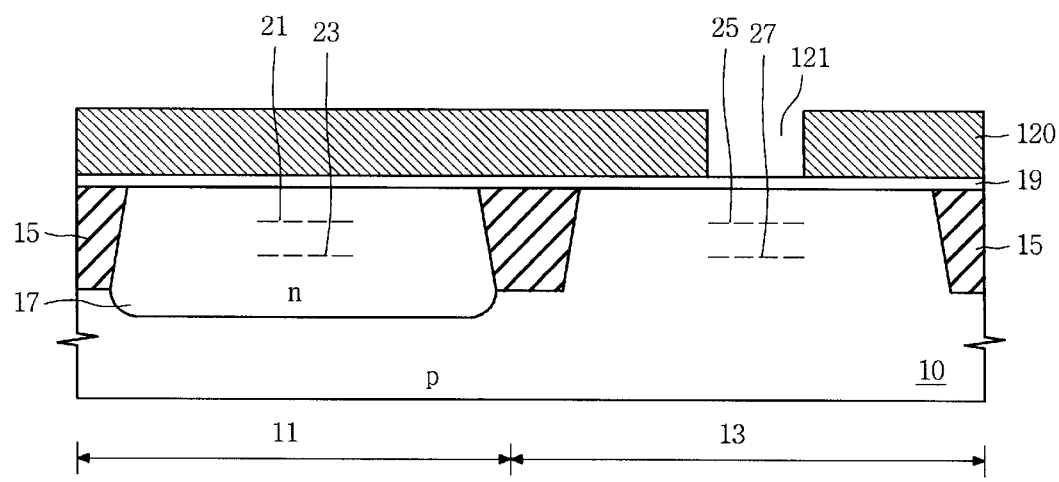

As suggested by FIG. 5, the photoresist pattern 110 is removed and another photoresist pattern 120 is formed with an opening 121 to expose a part of a buffer oxide layer 19 in a region to form a gate of a NMOS transistor, covering the rest of the oxide layer 19. The photoresist pattern 120 is used as a mask for thinly ion implanting arsenic ions (As), for instance, to the silicon substrate 10 of the active region 13 through the opening 121, to thereby form a channel ion implanting layer 25 for controlling the threshold voltage of the NMOS transistor. The photoresist pattern 120 is used as mask for deeply ion implanting phosphorus (P) ions into the silicon substrate 10 of the active region 13 through the opening 121, to thereby form a channel-stop ion-implanted layer 27 to prevent punch-through.

In the accompanying drawings, the channel ion-implanted layer 21 and channel stop ion-implanted layer 23 of the PMOS transistor have been formed prior to the ion-implanted layer 25 and channel stop ion-implanted layer 27 of the NMOS transistor. However, the channel ion-implanted layer 25 and channel stop ion-implanted layer 27 of the NMOS transistor may be formed prior to those 21, 23 of the PMOS transistor. Because the aforementioned channel ion-implanted layers 21, 25 and channel stop ion-implanted layers 23, 27 do not relate to the core of the present invention, they will not be shown in the following drawings from FIG. 6 on.

Figure 6:
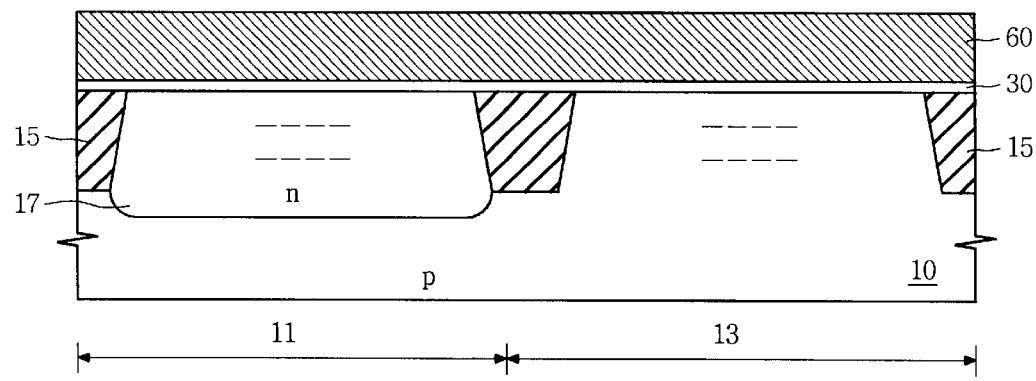

As shown in FIG. 6, an etching process is performed to substantially completely remove the buffer oxide layer 19 to expose the surface of the silicon substrate 10. Then, on the silicon substrate 10 above the active regions 11, 13, the gate oxide layer 30 is formed to a thickness of approximately 1–5 nm, and an undoped polysilicon layer 60 is deposited over the gate oxide layer 30 to a thickness of approximately 200–300 nm.

Figure 7:
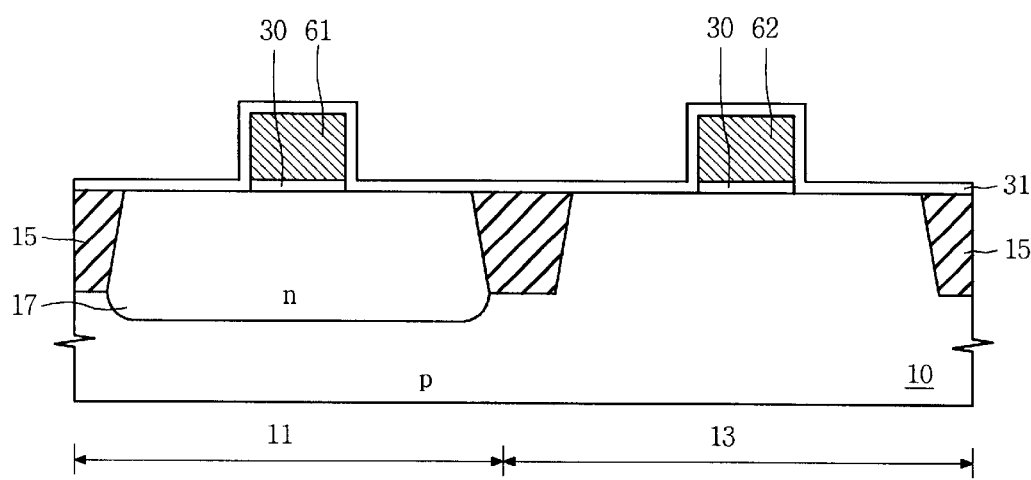

As shown in FIG. 7, a photo etching process is performed for patterning the polysilicon layer 60 into the patterns of the first and second polysilicon gates 61, 62 of the PMOS and NMOS transistors, respectively. Then, an oxidation process is performed on the polysilicon gates 61, 62 for growing an oxide layer 31 to a thickness of approximately 3–10 nm on the surface of the first and second polysilicon gates 61, 62. The surface of the silicon substrate 10 outside the patterns of the first and second polysilicon gates 61, 62 is partially oxidized. Thus, only the gate oxide layer 30 below the patterns of the first and second polysilicon gates 61, 62 maintains its initial thickness.

Figure 8:
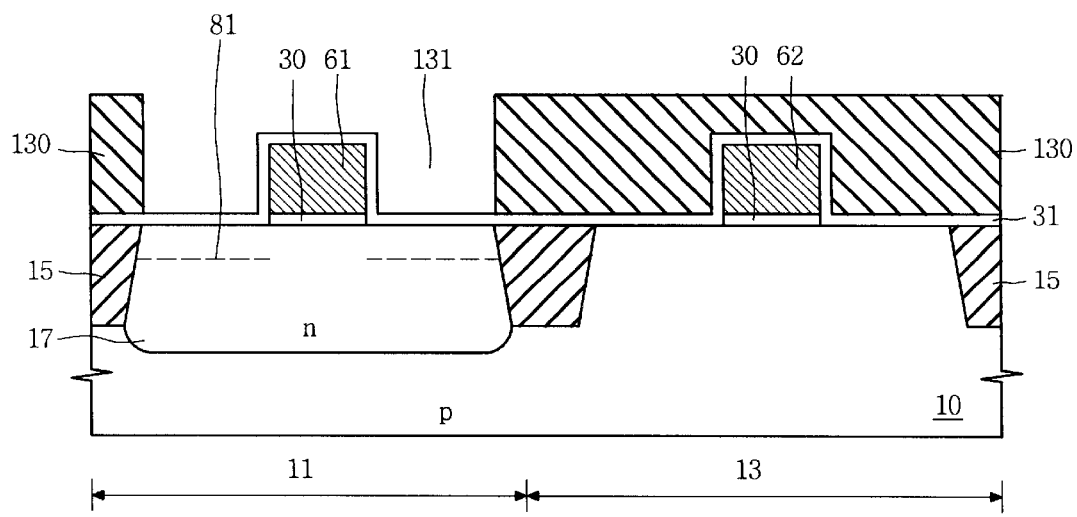

As shown in FIG. 8, a photoresist pattern 130 is formed to a thickness greater than that of the second polysilicon gate 62, having an opening 131 to expose the oxide layer 31 of the active region 11 of the PMOS transistor and covering the rest of the oxide layer 31. Then, the photoresist pattern 130 and the first polysilicon gate 61 are used as a mask for thinly ion implanting low-density boron ions to the n type will 17 to form an ion-implanted layer 81 for low-density source/drain regions. At this time, the ion implanting process is performed at a dose of approximately 1E13–1E14 atoms/cm$^2$, tilting angle of approximately 7–45 degree and at an energy of approximately 15–30 KeV.

Figure 9:
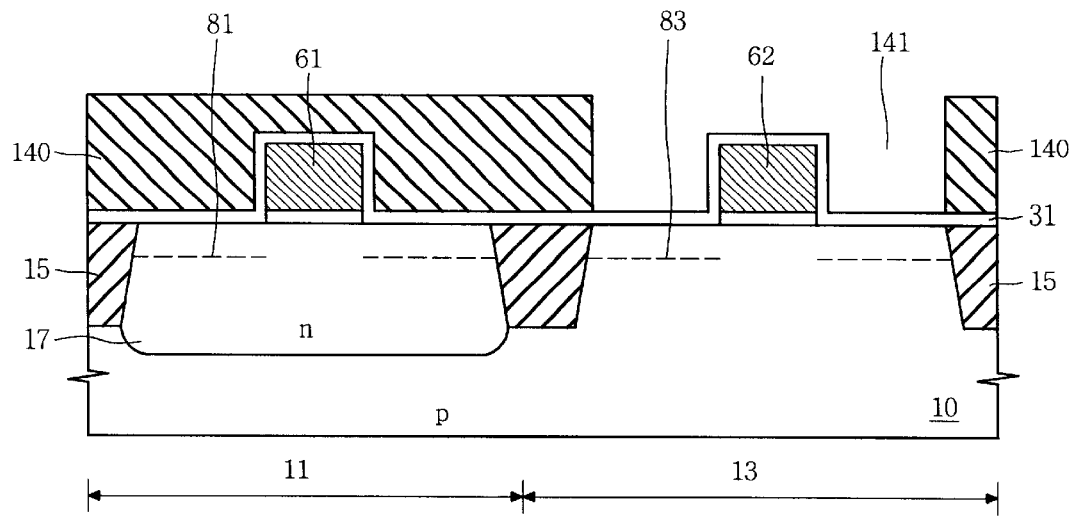

As shown in FIG. 9, after removing the photoresist pattern 130 shown in FIG. 8, a photoresist pattern 140 is formed to a thickness greater than that of the first polysilicon gate 61, having an opening 141 to expose the oxide layer 31 of the active region 13 of the NMOS transistor an covering the rest of the oxide layer 31. Then, the photoresist pattern 140 and the second polysilicon gate 62 are used as a mask for thinly ion implanting low-density phosphorus ions into the silicon substrate 10 to form an ion-implanted layer 83 for low-density source/drain regions.

In the accompanying drawings, the ion-implanted layer 81 of the PMOS transistor is formed prior to the ion-implanted layer 83 of the NMOS transistor. However, the ion-implanted layer 83 of the NMOS transistor may be formed prior to that 81 of the PMOS transistor.

Figure 10:
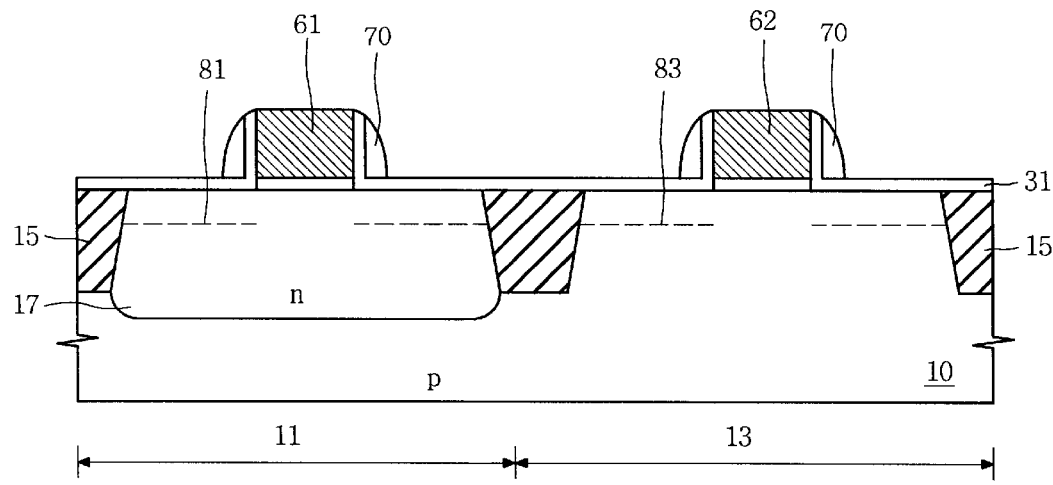

As shown in FIG. 10, after removal of the photoresist pattern 140 shown in FIG. 9, an insulating layer, e.g., an oxide layer, is deposited to a thickness of approximately 50–150 nm over the oxide layer 31. The insulating oxide layer is anisotropically etched to form spacers 70 on the sidewalls of the first and second polysilicon gate 61, 62.

Figure 11:
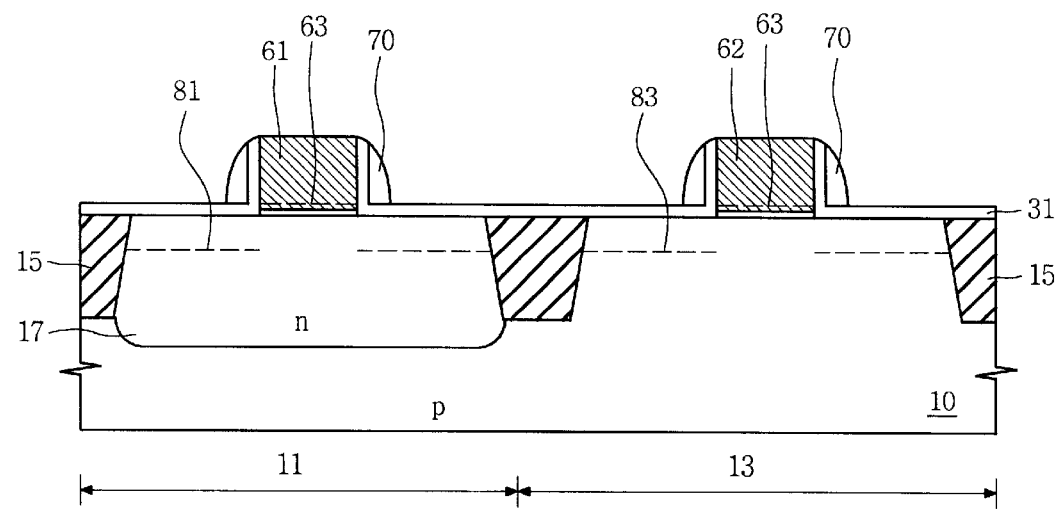

As shown in FIG. 11, without forming a masking photoresist pattern, ions to reduce electron depletion in the first and second polysilicon gates 61, 62, predetermined ions, e.g., fluorine ions, are ion implanted over the resultant structure to form an electron depletion preventing layer 63 in a bottom portion of the first and second polysilicon gates 61, 62. At this time, the ion implanting process is performed at a dose of approximately 1E15–5E15 atoms/cm$^2$ and at an energy of approximately 15–100 KeV. In addition, instead of fluorine ions, silicon (Si), germanium (Ge), nitrogen (N), or argon (Ar) ions may be ion-implanted to form the electron depletion preventing layer 63.

In this case, even if the fluorine ions are implanted to the active region for the source/drain region, it is expected that all the ions would completely disappear at the source/drain region after subsequent processes. Thus, an additional mask is not required.

Figure 12:
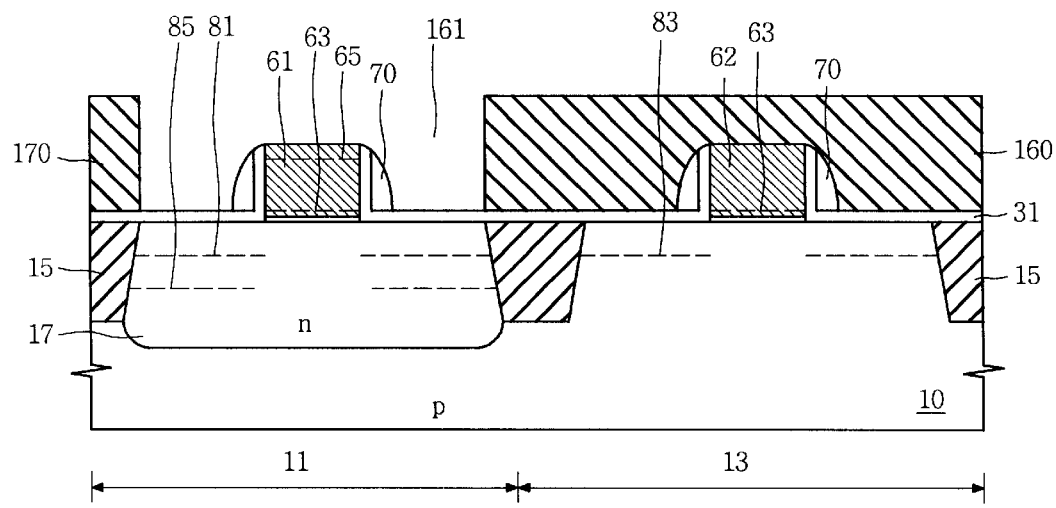

Next, the electron depletion preventing layer 63 ion-implanted with fluorine ions which facilitate the diffusion of boron ions is formed in a bottom portion of the first polysilicon gate 61. When the ions from the ion-implanted layer 85 to be formed later as shown in FIG. 12 are diffused by a following annealing process to form a P+ source/drain region 80 in FIG. 14, the boron ions from the ion-implanted layer 65 (See FIGS. 2 and 12) are simultaneously diffused without being affected by fluorine ions before reaching the electron depletion preventing layer 63. Also, the activation rate of boron ions can be increased after reaching the electron depletion preventing layer 63. Therefore, the present invention can be advantageous in preventing penetration of boron ions as well as reducing electron depletion in the first polysilicon gate 61.

Similarly, the electron depletion preventing layer 63 is formed in a bottom portion of the second polysilicon gate 62 to reduce the electron depletion therein.

As shown in FIG. 12, a photoresist pattern 160 is formed on the resultant structure to a thickness greater than that of the second polysilicon gate 62 with an opening 161 to expose an active region 11. Then, the photoresist pattern 160, the first polysilicon gate 61 and spacers 70 are used as a mask for ion-implanting high-density boron ions to n type well 17 to is thereby form an ion-implanted layer 85 for the P+ source/drain region. At the same time, an ion-implanted layer 65 of high-density boron ions is formed in an upper portion of the first polysilicon gate 61 to increase the conductivity thereof.

Figure 13:
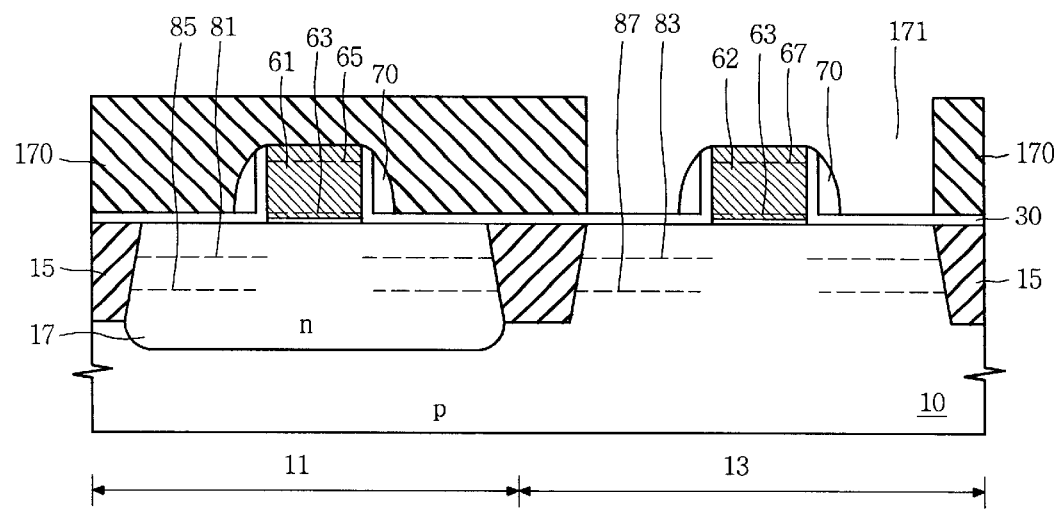

As shown in FIG. 13, after removal of the photoresist pattern 160 shown in FIG. 12, a photoresist pattern 170 is formed in a region to form a gate of a NMOS transistor with an opening 171 to expose the active region 13. The photoresist pattern 170 is formed over the resultant structure to a thickness greater than that of the first polysilicon gate 61. The photoresist pattern 170, the second polysilicon gate 62 and spacers 70 are used as mask for ion implanting high-density phosphorus (P) ions to the silicon substrate 10, to thereby form an ion-implanted layer 87 for forming N+ source/drain regions.

At the same time, another ion-implanted layer 67 of high density phosphorus ions is formed in an upper portion of the second polysilicon gate 62 to increase the conductivity thereof.

Figure 14:
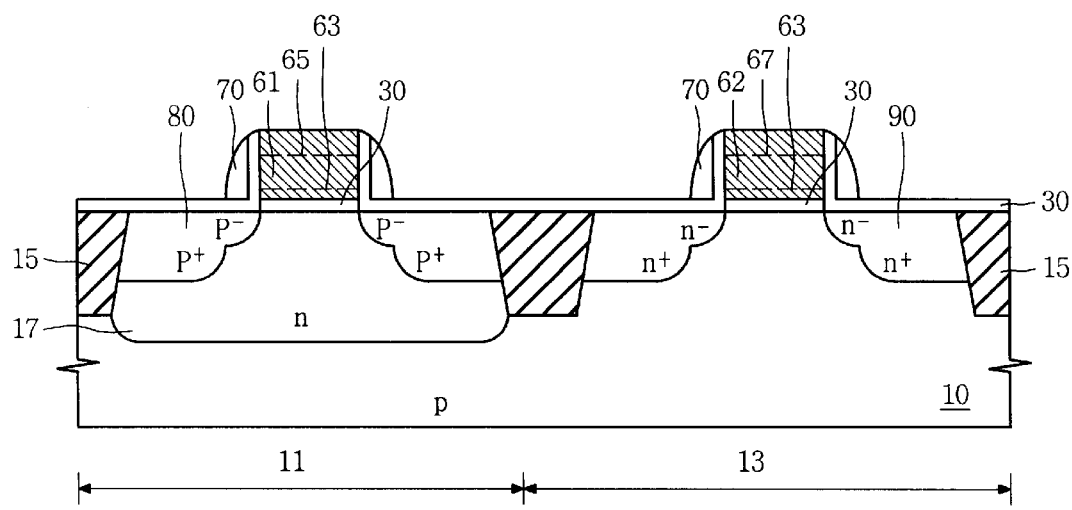

As shown in FIG. 14, after removal of the photoresist pattern 170 shown in FIG. 13, a rapid thermal process (RTP) is performed at approximately 1000 for approximately 30 seconds to the ions of the ion-implanted layers 81, 85 and those of the ion-implanted layers 83, 87 to form the source/drain regions 80, 90 of the PMOS and NMOS transistors.

Next, boron ions from the first polysilicon gate 61 are diffused. Because the electron depletion preventing layer 63 is formed in the bottom portion of the first polysilicon gate 61, the boron ions are not affected by fluorine ions before reaching the electron depletion preventing layer 63, and the fluorine ions can increase the activation rate of boron ions after reaching the electron depletion preventing layer 63. Therefore, the invention can reduce the electron depletion and penetration of boron ions into the transistor channel. Thus, operational properties of the devices are not affected, and the operational reliability of the product is improved. In addition, fluorine ions of the electron depletion preventing layer 63 are helpful to reduce the electron depletion in the second polysilicon gate 62.

Figure 15:
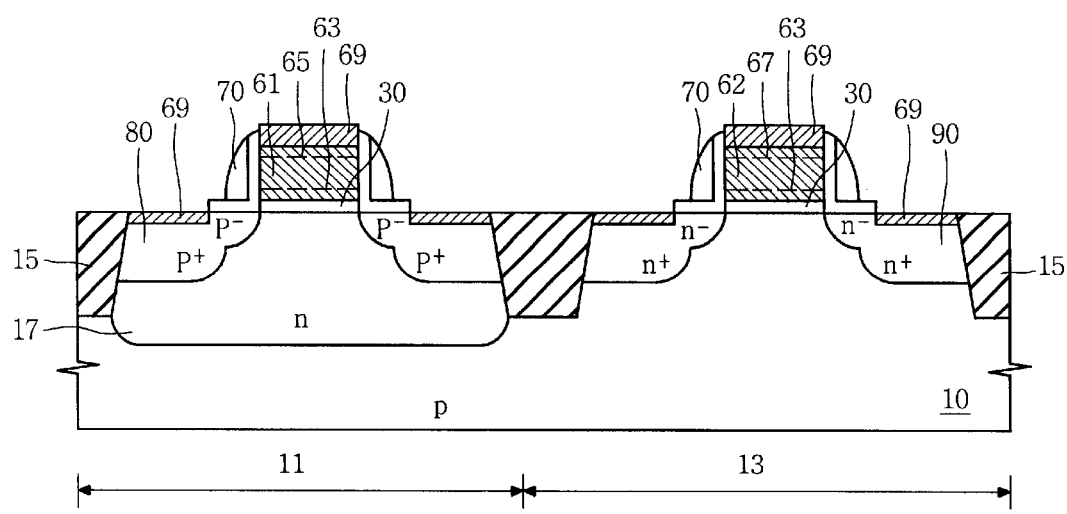

As shown in FIG. 15, a conventional silicide process is performed to form, preferably concurrently, silicide layers 69 on top of the first and second polysilicon gates 61, 62 and on top of the source/drain regions 80, 90.

Finally, even if not shown in the drawings, an insulating interlayer is deposited on the resultant structure. A contact hole forming process and a metal wiring process are performed to complete formation of CMOSFET devices as these last steps not illustrated are well known.

As described above, in the present invention, an electron depletion preventing layer is formed in the bottom portion of the polysilicon gate of the PMOS transistor, and the ion-implanted layers of boron ions are, then, formed in the P+ source/drain regions of the PMOS transistor. An ion-implanted layer of boron ions is also formed in an upper portion of the polysilicon gate to increase the conductivity of the gate. Therefore, when the P+ source/drain region is formed by diffusion of ions of the ion-implanted layer, the boron ions of the polysilicon gates are simultaneously diffused. Because of these novel features of the present invention where the electron depletion preventing layer is formed in the bottom portion of the polysilicon gate, boron ions can reach the bottom portion of the polysilicon gate without being affected by fluorine ions and the activation rate of boron ions can then be increased by influence of the fluorine ions after arrival of boron ions at the bottom portion of the polysilicon gates. Consequently, electron depletion and boron penetration can be reduced. This significantly stabilizes the operational properties of MOSFET devices.

Having described a preferred embodiment of the invention with reference to the accompanying drawings, it is to be understood that the invention is not limited to the aforementioned precise embodiment, and that various changes and modifications may be effected therein by one skilled in the art without departing from the scope or spirit of the invention as defined in the appended claims.

What is claimed is:

1. A semiconductor device, comprising:

a silicon substrate formed with a field oxide layer for electrically isolating a first active region for a first transistor and a second active region for a second transistor;

a gate oxide layer formed on the first and second active regions;

a first polysilicon gate formed on a predetermined region of the gate oxide layer in the first active region;

a second polysilicon gate formed on a predetermined region of the gate oxide layer in the second active region;

an electron depletion preventing layer formed in a bottom portion of the first polysilicon gate;

source/drain regions formed apart in the first active region with the first polysilicon gate being positioned therebetween; and source/drain regions formed apart in the second active region with the second polysilicon gate being positioned therebetween.

2. The device, as defined in claim 1, further comprising a spacer formed of an insulating material formed on sidewalls of the first and second polysilicon gates.

3. The device, as defined in claim 1, further comprising an electron depletion preventing layer formed in a bottom portion of the second polysilicon gate.

4. The device, as defined in claim 1, wherein the electron depletion preventing layer is formed by ion implantation, and wherein the ion is selected from the group consisting of fluorine, silicon, germanium, nitrogen, and argon.

5. The device, as defined in claim 4, wherein the ion implantation is performed at a dose of approximately 1E15–5E15 atoms/cm$^2$ and at an energy of approximately 15–100 KeV.

6. The device, as defined in claim 1, further comprising an ion-implanted layer in an upper portion of the first polysilicon gate, the ion-implanted layer being ion-implanted with predetermined ions.

7. The device, as defined in claim 6, wherein the predetermined ions of the ion-implanted layer to increase conductivity and those of the electron depletion preventing layer are both included in the first polysilicon gate.

8. The device, as defined in claim 6, wherein the region of the electron depletion layer having highest impurity concentration is placed lower than corresponding region of the ion-implanted layer having its highest impurity concentration.

9. The device, as defined in claim 1, wherein the first and second transistors are PMOS and NMOS transistors, respectively.

10. A method for fabricating a semiconductor device, comprising:

forming a field oxide layer between first and second active regions for first and second transistors on the silicon substrate, respectively;

forming a gate oxide layer on the first and second active regions;

forming first and second polysilicon gates on predetermined regions of the gate oxide layer in the first and second active regions, respectively;

selectively forming an electron depletion preventing layer in a bottom portion of the first polysilicon gate; and forming source/drain regions in the first and second active regions adjacent the first and second gates, respectively.

11. The method, as defined in claim 10, further comprising forming low density source/drain regions in the first and second active regions.

12. The method, as defined in claim 10, further comprising forming a spacer formed of an insulating material on sidewalls of the first and second polysilicon gates.

13. The method, as defined in claim 10, further comprising forming an electron depletion preventing layer in a bottom portion of the second polysilicon gate to reduce electron depletion therein.

14. The method, as defined in claim 13, wherein said steps of forming the electron depletion preventing layer of the first and second polysilicon gates are performed by ion implanting fluorine, silicon, germanium, nitrogen, or argon ions thereto.

15. The method, as defined in claim 14, wherein the ion implanting is performed at a dose of approximately 1E15–5E15 atoms/cm$^2$ and at an energy of approximately 15–100 KeV.

16. A MOSFET device, comprising:

a silicon substrate formed with a field oxide layer for electrically isolating a first active region for a first transistor;

a gate oxide layer formed on the first active region;

a polysilicon gate formed over the gate oxide layer;

an electron depletion preventing layer formed in a bottom portion of the polysilicon gate; and source/drain regions formed on either side of the polysilicon gate.

17. The MOSFET device, as defined in claim 16, wherein the polysilicon gate includes an ion-implanted layer formed in an upper portion of the polysilicon gate to increase the conductivity thereof.

18. The MOSFET device, as defined in claim 16, wherein the electron depletion preventing layer is formed by ion implantation.

19. The MOSFET device, as defined in claim 18, wherein the ion used for the ion implantation is selected from the group consisting of fluorine, silicon, germanium, nitrogen, and argon.

* * * * *

UNITED STATES PATENT AND TRADEMARK OFFICE
CERTIFICATE OF CORRECTION

PATENT NO. : 6,313,020 B1
DATED : November 6, 2001
INVENTOR(S) : Hyun-Sik Kim and Hyung-Ho Shin It is certified that error appears in the above-identified patent and that said Letters Patent is hereby corrected as shown below:

Column 5,
Line 59, "will" should read -- well --;

Column 6,
Line 2, "an" should read -- and --.
Line 61, "to is thereby" should read -- to thereby --.

Column 8,
Lines 19-20, "formed in a bottom portion of the gate oxide layer in the second active region;" should read -- formed in the first polysilicon gate, wherein a highest concentration region of the electron depletion preventing layer is formed in a bottom portion of the first polysilicon gate; --.
Lines 49-53, "wherein the region of the electron depletion layer having highest impurity concentration is placed lower than corresponding region of the ion-implanted layer having its highest impurity concentration." should read -- wherein the highest impurity concentration region of the electron depletion layer is placed lower than a highest impurity concentration region of the ion-implanted layer. --.

Column 9,
Line 2, "layer in a bottom portion of the first polysilicon gate;" should read -- layer in the first polysilicon gate, wherein a highest concentration region of the electron depletion preventing layer is formed in a bottom portion of the first polysilicon gate; --.

UNITED STATES PATENT AND TRADEMARK OFFICE
CERTIFICATE OF CORRECTION

PATENT NO.    : 6,313,020 B1
DATED         : November 6, 2001
INVENTOR(S)   : Hyun-Sik Kim and Hyung-Ho Shin It is certified that error appears in the above-identified patent and that said Letters Patent is hereby corrected as shown below:

<u>Column 10,</u>
Lines 7-8, "formed in a bottom portion of the polysilicon gate;" should read -- formed in a polysilicon gate, wherein a highest concentration region of the electron depletion preventing layer is formed in a bottom portion of the first polysilicon gate; --.

Signed and Sealed this

Nineteenth Day of November, 2002

*Attest:*

*Attesting Officer*

JAMES E. ROGAN
*Director of the United States Patent and Trademark Office*